United States Patent [19]

Cochran et al.

[11] 4,132,950

[45] Jan. 2, 1979

[54] CLARIFYING RADIO RECEIVER

[75] Inventors: Michael J. Cochran, Richardson; Edward R. Caudel, Dallas, both of Tex.

[73] Assignee: Texas Instruments Incorporated, Dallas, Tex.

[21] Appl. No.: 791,629

[22] Filed: Apr. 27, 1977

[51] Int. Cl.$^2$ .............................................. H04B 1/40
[52] U.S. Cl. ........................................ 325/25; 325/63
[58] Field of Search ....................... 325/15, 20, 21, 25, 325/63; 328/167; 333/70 T; 329/105

[56] References Cited

U.S. PATENT DOCUMENTS

| | | | |
|---|---|---|---|
| 3,588,701 | 6/1971 | Kahn | 325/15 |
| 3,641,434 | 2/1972 | Yates | 325/25 |
| 3,835,384 | 9/1974 | Liff | 325/25 |
| 3,983,484 | 9/1976 | Hodama | 325/25 |
| 3,997,973 | 12/1976 | Buss | 307/304 |
| 4,027,242 | 5/1977 | Yamanaka | 325/25 |

*Primary Examiner*—Robert L. Richardson
*Assistant Examiner*—Michael A. Masinick
*Attorney, Agent, or Firm*—Stephen S. Sadacca; Rene Grossman; James T. Comfort

[57] ABSTRACT

A clarifying radio receiver has a charge transfer device filter which is coupled to receive input signals consisting of a plurality of frequency bands lying respectively within a plurality of non-overlapping frequency channels. The filter simultaneously receives clocking signals, and has a plurality of spaced apart passbands which shift in frequency dependent upon the frequency of the clocking signals. Clocking means generate the clocking signals with an incrementally adjustable frequency. The increments are smaller than the width of the channels thereby permitting a selected one of the filter passbands to be precisely aligned about a fixed reference frequency.

8 Claims, 32 Drawing Figures

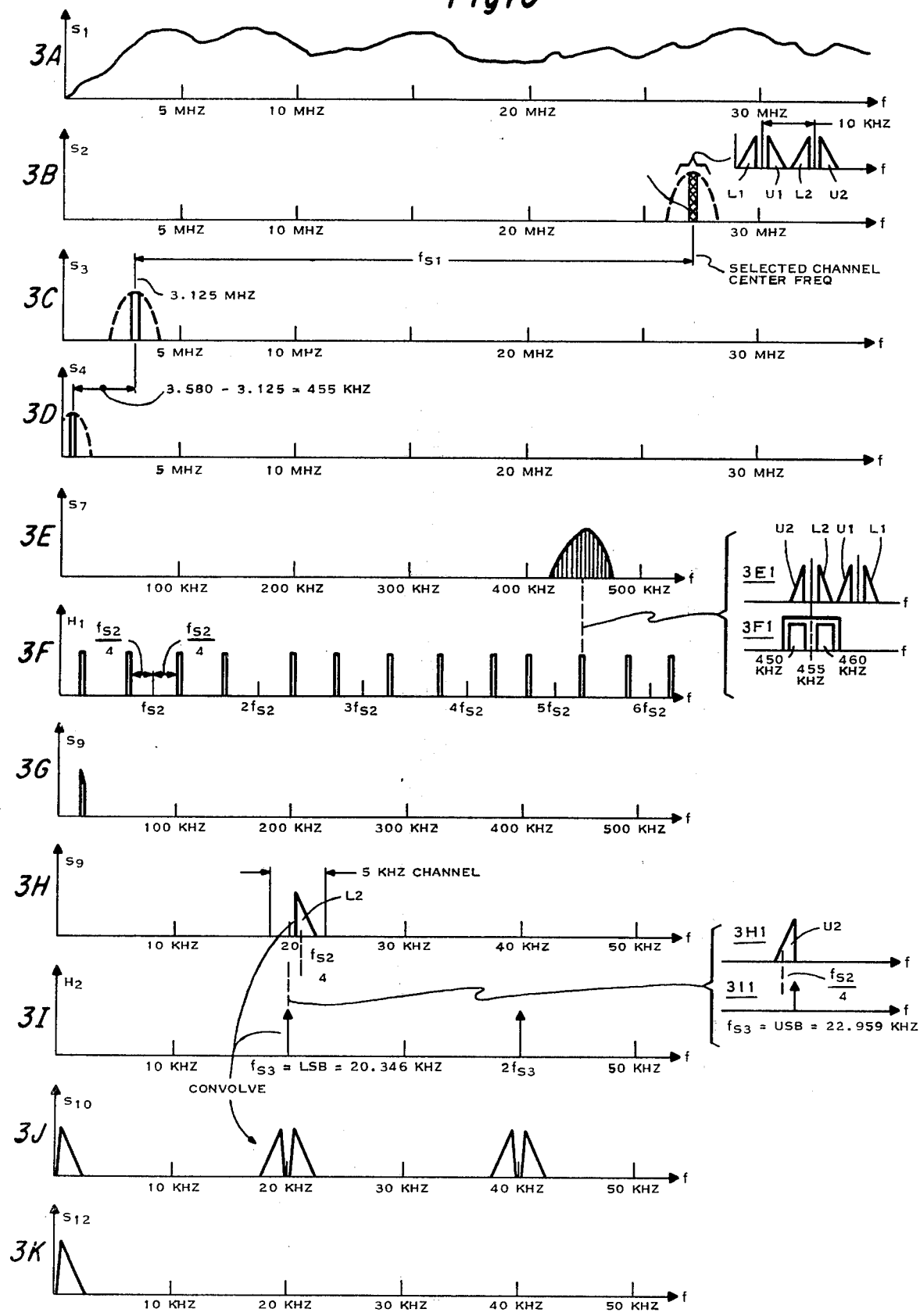

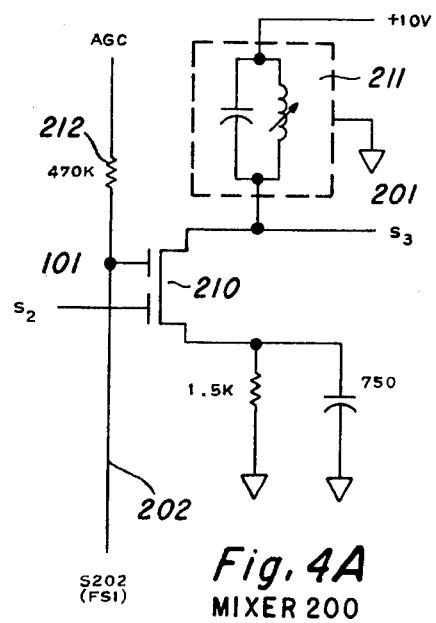
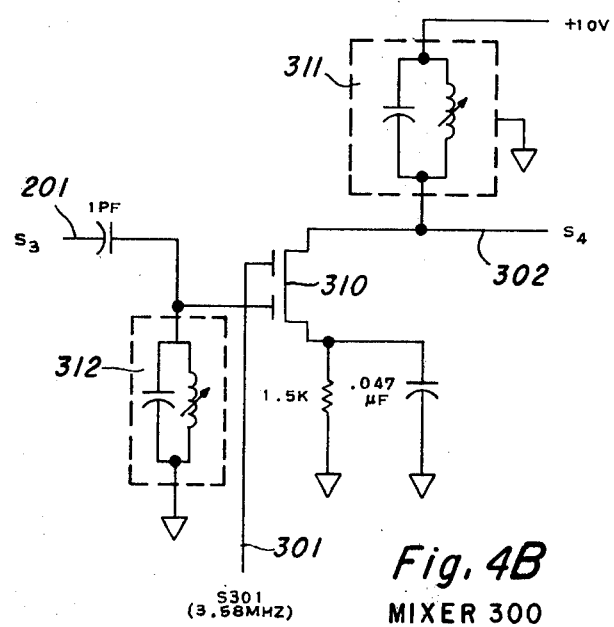
Fig. 4A MIXER 200
Fig. 4B MIXER 300

CCD-FILTER 700

AM/SSB DETECTOR 900

CLOCKING MODULE 3000

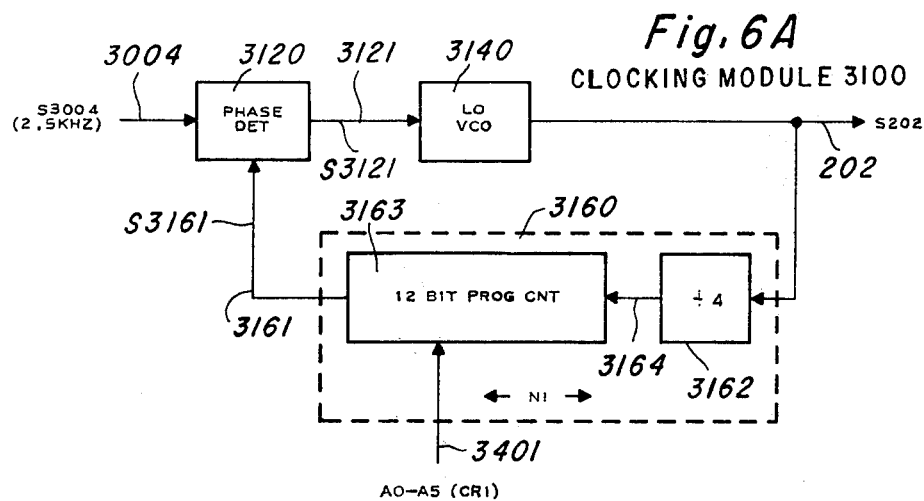
Fig. 6A
CLOCKING MODULE 3100
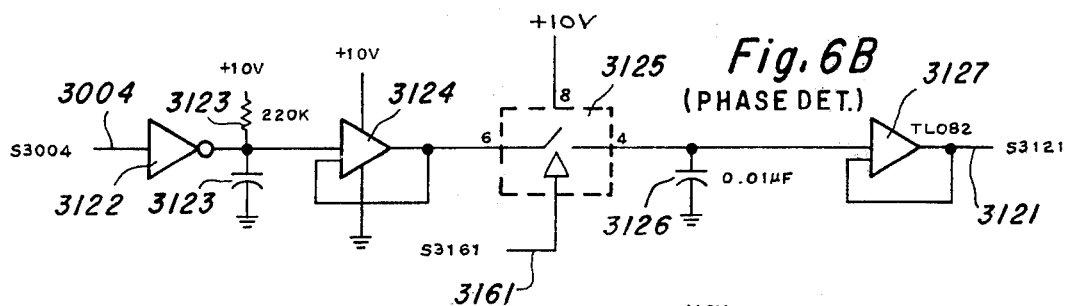
Fig. 6B (PHASE DET.)
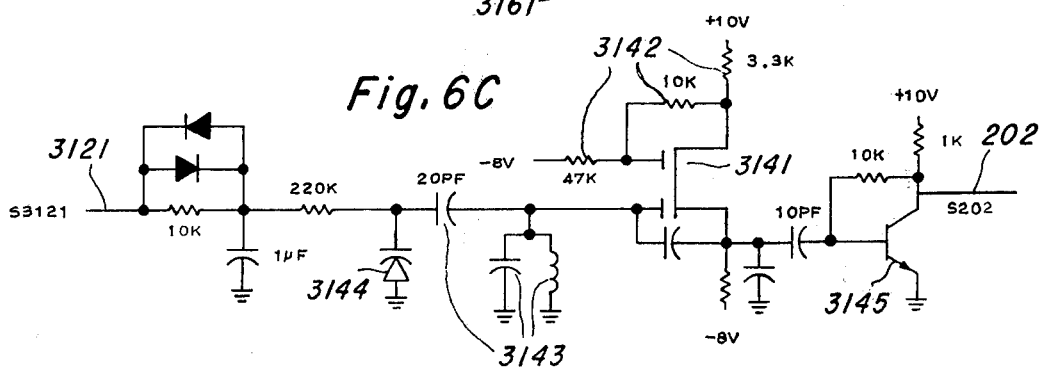
Fig. 6C

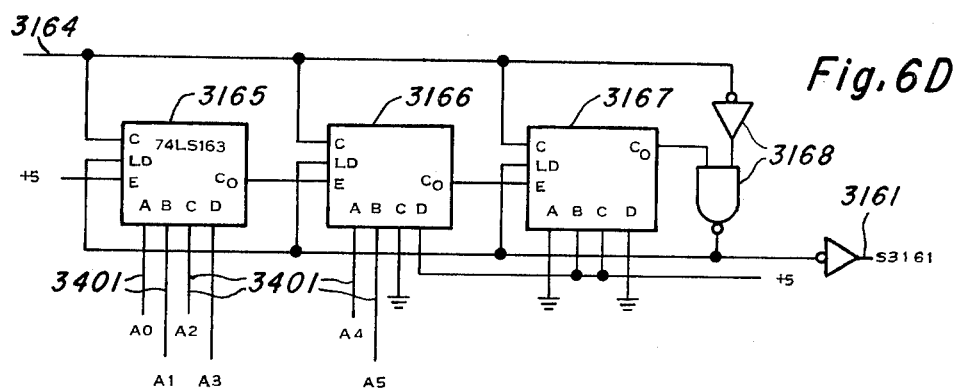
Fig. 6D
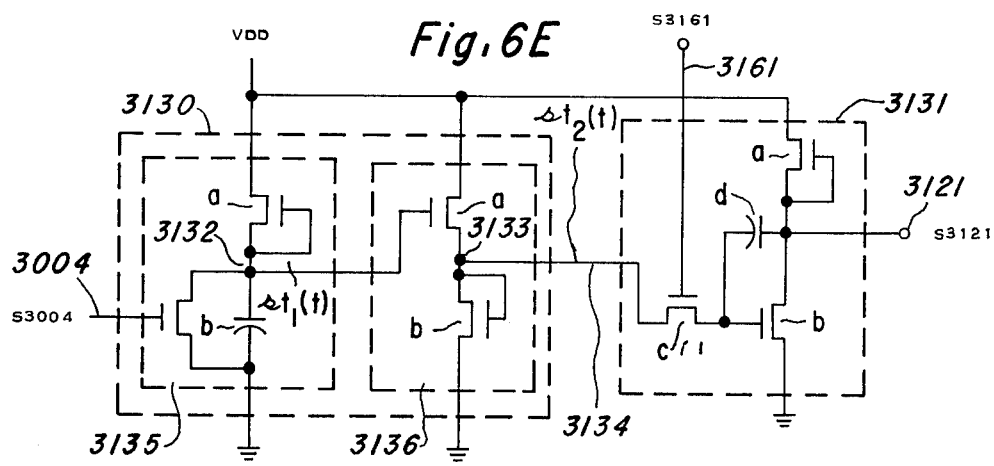
Fig. 6E
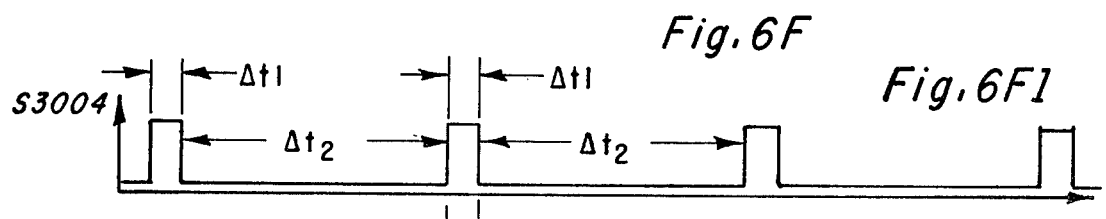
Fig. 6F
Fig. 6F1
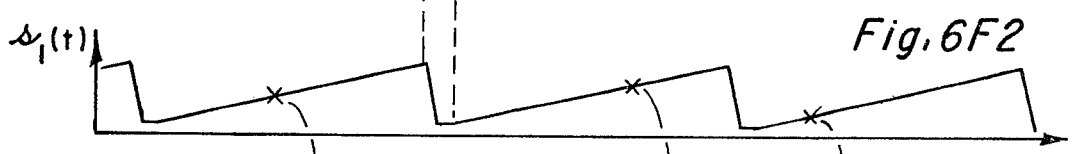
Fig. 6F2
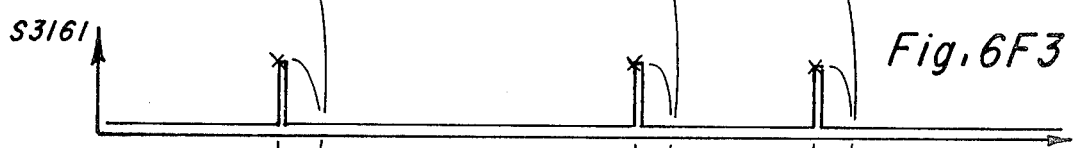
Fig. 6F3
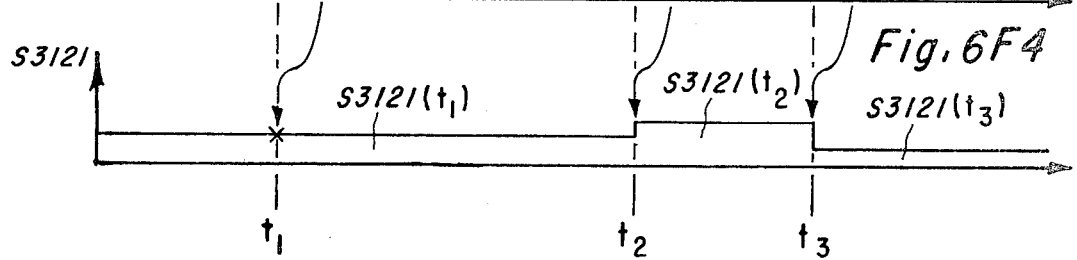
Fig. 6F4

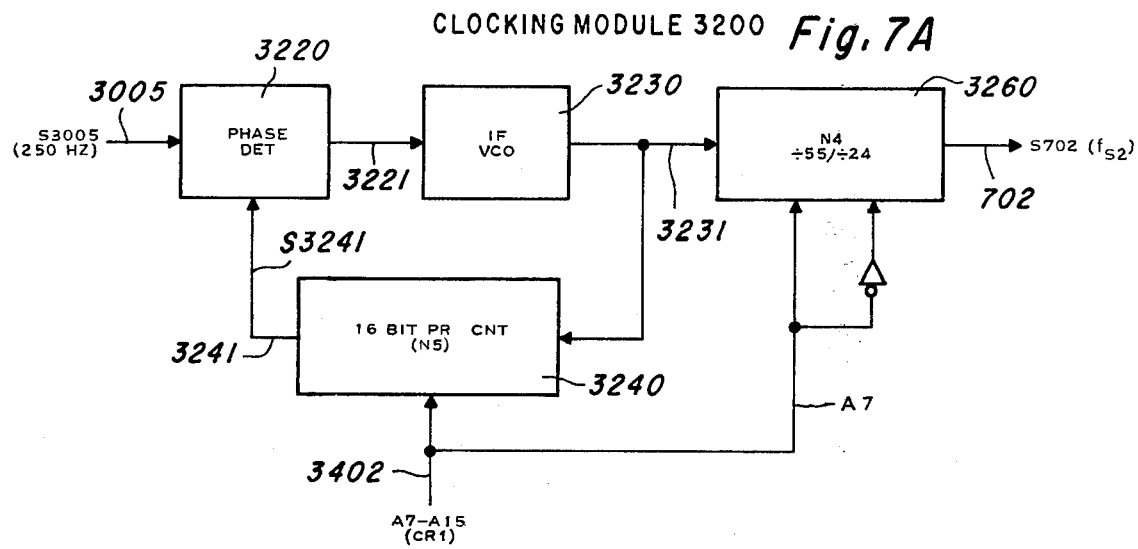
Fig. 7A
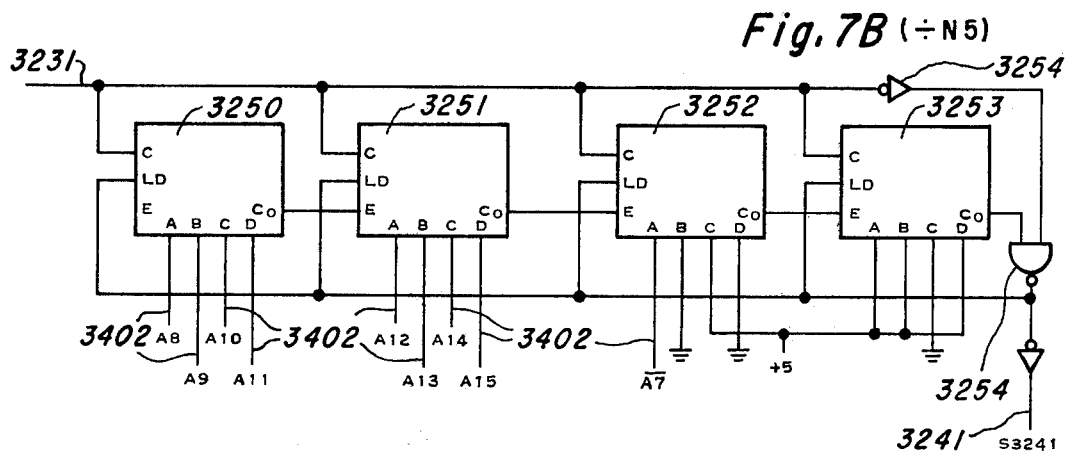
Fig. 7B (÷N5)
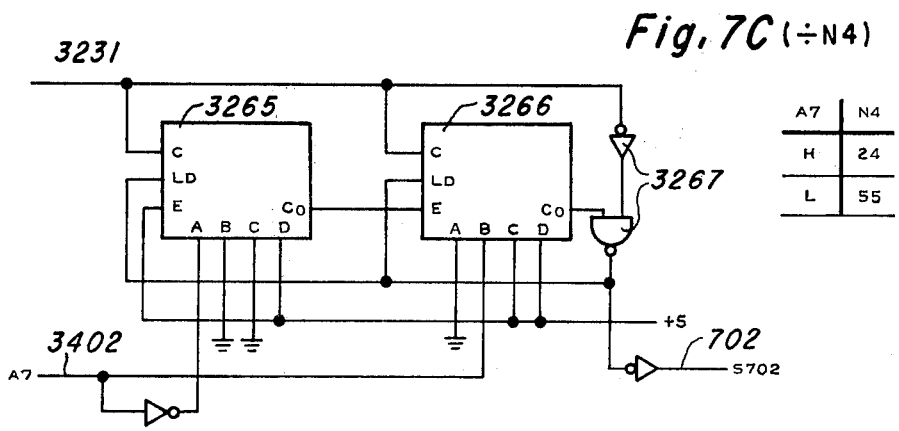
Fig. 7C (÷N4)

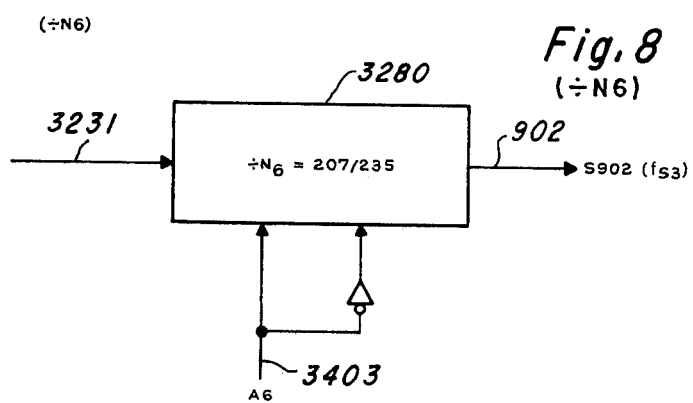

CLARIFYING RADIO RECEIVER

BACKGROUND OF THE INVENTION

This invention relates to analog signal processing, and more particularly to radio receivers with clarification control means. This invention further relates to the transceiver and components thereof described and claimed in the following U.S. Patent Applications filed of even date with and assigned to the assignee of the present invention: U.S. Ser. No. 791,611 entitled "A Digitally Transmitting Transceiver" by Edward R. Caudel and William R. Wilson; U.S. Ser. No. 791,253 entitled "A Transceiver Capable of Sensing A Clear Channel" by Jerry D. Merryman, Michael J. Cochran and Edward R. Caudel; U.S. Ser. No. 791,449 entitled "An Automatically Clarifying Radio Receiver" by Michael J. Cochran and Edward R. Caudel; U.S. Ser. No. 791,254 entitled "A Computer Controlled Radio System" by Michael J. Cochran and Edward R. Caudel; U.S. Ser. No. 791,450 entitled "A Transceiver With Only One Reference Frequency" by Michael J. Cochran; U.S. Serial No. 791,614 entitled "A Charge Transfer Device Radio System" by Michael J. Cochran; U.S. Ser. No. 791,265 entitled "A Signal Strength Measuring Transceiver" by Edward R. Caudel; U.S. Ser. No. 791,256 entitled "A Highly Selective Programmable Filter Module" by Michael J. Cochran and Edward R. Caudel; U.S. Ser. No. 791,616 entitled "A Dual Processor Transceiver" by Edward R. Caudel, William R. Wilson and Thomas E. Merrow; U.S. Ser. No. 791,264 entitled "An Electronic Phase Detector Circuit" by Michael J. Cochran. Radio systems receive radiated electronic input signals comprised of a plurality of non-overlapping frequency bands, filter a selectable band from the plurality, frequency shift the filtered band from radio frequencies to a lower frequency, and convert the selected band to audible sounds. The input signals may be amplitude modulated (AM), or single sideband (SSB) signals as an example. Antenna means receive the radiated input signals. Filtering devices are included in the radio system to select one of the bands from the plurality. Mixing devices are included to frequency shift the selected band. And demodulator devices are included to demodulate the selected band.

In the past, single sideband signals have been particularly troublesome to receive with clarity. The problem arises because sideband signals have no carrier to lock onto to aide in demodulation. And demodulation is made more difficult because transmitters which send single sideband signals are not required to align the signals with a fixed reference frequency, but only are required to place the sideband signals somewhere within a frequency channel. Thus, the receiving system is required to demodulate the sideband signals regardless of where they lie within their respective channel. This requirement is known in the art as the clarifying function of a receiver.

Prior art receivers varied the frequency of mixing clock signals in order to compensate for variations of where the sideband signals actually resided in its assigned channel. That is, mixing devices mixed the sideband signals with either a relatively high frequency or relatively low frequency dependent upon whether the sideband signal laid in the upper frequency portion or the lower frequency portion of its channel. By comparison, one embodiment of the radio system herein described varies the clocking frequency of a transversal filter to clarify the sideband signal being received. The transversal filter has a plurality of spaced apart passbands which define the frequency range of its output signals. Both the center frequency and the bandwidth of the passbands are dependent upon the clocking frequency of the filter. Thus, a novel feature of the invention is that the mixing clock signals are not varied to perform a clarifying function, but are varied solely for the purpose of channel selection. As a result, the clocking means for generating the mixing clock signals need only be capable of generating frequencies in increments of the channel spacing. Conversely, the clocking means for generating the filter clock signals must be capable of generating frequencies which are adjustable by small increments about a predetermined nominal frequency.

A sampling demodulator couples to the output of the charge transfer device filter for demodulating signals from the lowest frequency passband of the filter. The frequency of the demodulator sampling clock is not dependent upon where the sideband signals lie within their channel. This is because the lowest frequency passband of the filter will not move appreciably in response to the clocking frequency of the filter, whereas higher order passbands of the filter will be shifted to precisely align with the frequencies of the selected band regardless of where it lies within its respective channel.

Accordingly, it is one object of the invention to provide an improved single sideband radio receiver.

It is another object of the invention to provide a radio system capable of clarifying single sideband signals without varying the mixing frequency of any mixing device.

Another object of the invention is to provide a radio system having a charge transfer device filter for clarifying single sideband signals.

SUMMARY OF THE INVENTION

These and other objectives are accomplished in accordance with the invention by a radio system which includes clocking means for generating clocking signals with an incrementally adjustable frequency. The clocking means couples to a charge transfer device transversal filter for providing the incrementally adjustable clocking signals thereto. Single sideband signals are applied to a signal input of the charge transfer device filter. The sideband signals lie somewhere within an assigned frequency channel. The transversal filter has passbands having a center frequency and bandwidth porportional to the frequency of the filters clocking signal. The clocking means adjust the filters clocking signal in small increments such that one of the filters passbands in precisely aligned with a fixed reference frequency regardless of where the band lies within its respective channel.

In an alternative embodiment, the frequency of the filter clocking signal is not varied to perform the clarify function. Instead, a sampling demodulator circuit is coupled to the output of the filter and the sampling frequency of the demodulator is varied by small increments to perform the clarify function on the signal received from the output of the filter. In either case, the mixing frequencies of mixers included within the radio system are varied solely to perform channel selection functions but not to perform clarifying functions.

DESCRIPTION OF THE DRAWINGS

The essential features believed to be characteristic of the invention are set forth in the appended claims; the invention itself, however, as well as other features and advantages thereof, may best be understood by referring to the following detailed description of the preferred embodiments when read in reference to the accompanying drawings; wherein:

FIGS. 3A-3K are a set of frequency diagrams illustrating signals in the frequency domain which are present at various points on the receive signal path of FIG. 2.

FIGS. 4A-4D are detailed circuit diagrams of each of the components comprising the signal path of FIG. 2.

FIGS. 6A-6F are detailed circuit diagrams of a clocking module 3100 included within FIG. 2.

FIGS. 7A-7C are detailed logic diagrams of a clocking module 3200 included within FIG. 2.

FIG. 8 is a detailed logic diagram of a divide by N6 counter which forms a portion of clocking module 3200.

DETAILED DESCRIPTION OF SPECIFIC EMBODIMENTS

Figure 1:
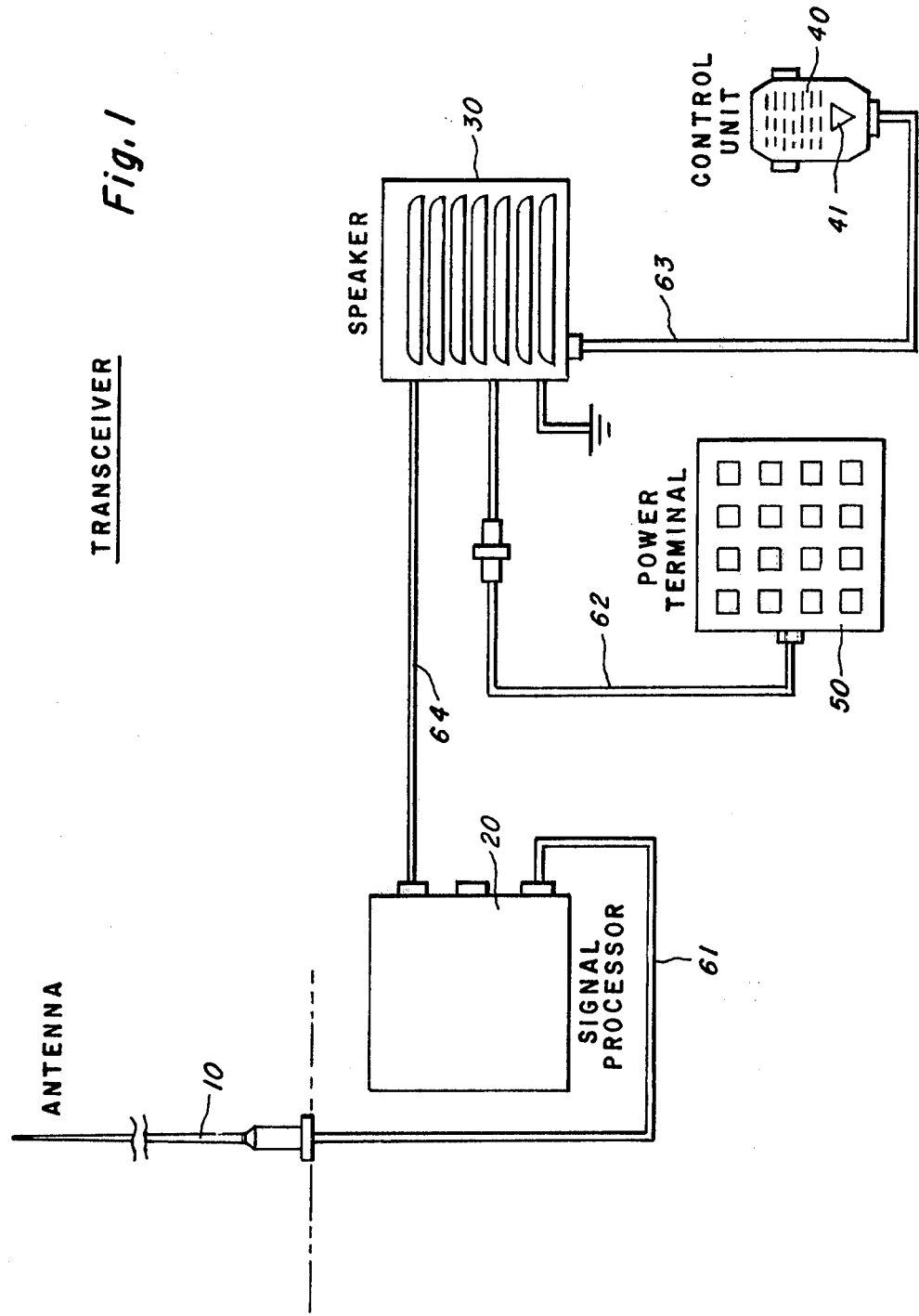
FIG. 1 is a block diagram illustrating the major components of a transceiver constructed according to the invention.

Referring now to FIG. 1, a block diagram illustrating the major components of a transceiver which is constructed according to the invention is illustrated. The transceiver is comprised of an antenna 10, a signal processing unit 20, a speaker 30, a control unit 40, and a power terminal 50. These components are electrically intercoupled by conductive cables 61-64 as illustrated in FIG. 1.

The transceiver of FIG. 1 has a transmit mode of operation and a receive mode of operation. Basically, in the transmit mode the operator speaks into a microphone 41 contained in control unit 40, and the audio signals are therein converted to electrical signals which are sent to analog signal processor 20 over cables 63 and 64. Signal processor 20 frequency shifts the received signal from an audio frequency to a frequency band of a selectable high frequency channel. The selected channel may be either a single sideband channel of approximately 5-kHz bandwidth, or an amplitude modulated channel of approximately 10 kHz. In either case the frequency shifted signals are sent via cable 61 to antenna 10 and therein transmitted via radiation.

In the receive mode, antenna 10 receives radiated electrical signals comprised of a plurality of frequency bands lying respectively within a plurality of nonoverlapping frequency channels. The plurality of frequency bands are sent to signal processor 20 via cable 61. Signal processor 20 filters a selectable band from the plurality of bands, and down shifts in frequency the selected band to an audible frequency range. The selected down shifted frequency band is sent to speaker 30 via cable 64 where it is therein converted to audible sounds.

Figure 2:
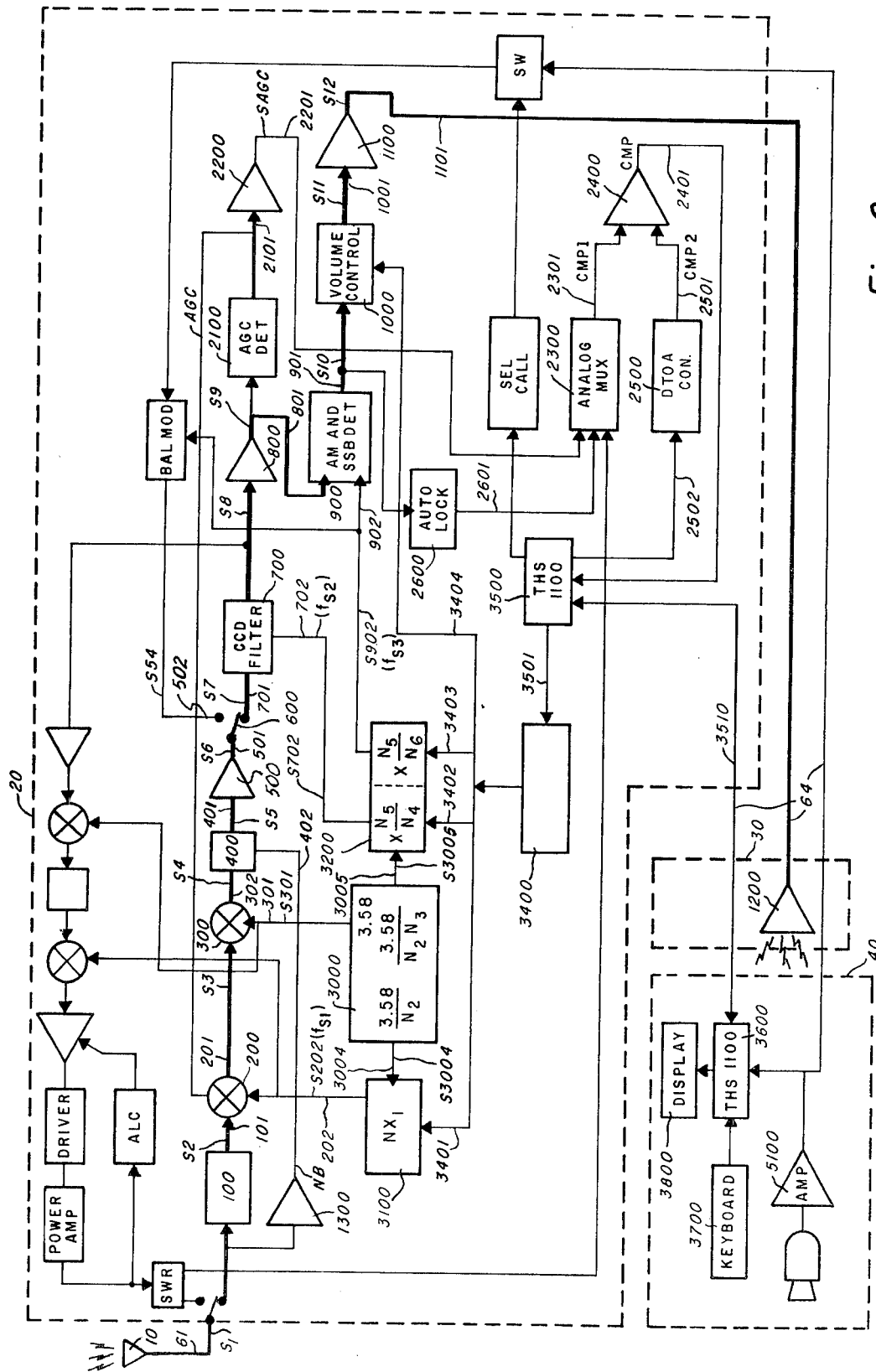
FIG. 2 is a more detailed block diagram of the transceiver of FIG. 1 wherein the receive signal path components are emphasized.

The manner in which the transceiver of FIG. 1 performs the above described receive operation is best understood by referring to FIG. 2 and FIG. 3. FIG. 2 is a circuit diagram of the transceiver of FIG. 1. The circuit includes a signal path which is operable in the receive mode and which is emphasized in FIG. 2 by a thickened line. Signals S1-S12 are present at various points (as illustrated in FIG. 2) on this signal path. FIG. 3 is a set of frequency diagrams illustrating some of the signals S1-S12 in the frequency domain.

Antenna 10 is the first element of the receive signal path. Cable 61 couples to the output of antenna 10 and signal S1 as illustrated in FIG. 3a is generated thereon. Basically, signal S1 is unfiltered and thus is comprised of frequency components which cover the electromagnetic spectrum. Lead 61 couples to filter 100. Filter 100 has an output lead 101 and signals S2 are generated thereon. As illustrated in FIG. 3b, signal S2 has a frequency range of approximately 26 MHz to 28 MHz. The skirt response of filter 100 is not critical as its only function is to pass the band of frequencies lying between 26.965 MHz and 27.405 MHz. This range of frequencies includes 40 amplitude modulated (AM) channels as presently assigned by the FCC. Table I lists the center frequency of each of the 40 channels. Each AM channel is divided into a lower sideband channel and an upper sideband channel. FIG. 3b illustrates the 26.965 MHz-27.405 MHz frequency range by the cross hatched areas S2a. FIG. 3B1 is a blow up of area S2a and single sideband channels L1, U1, L2, U2, lying within the first two AM channels are illustrated therein.

TABLE I

| CH | CENTER FREQUENCY | CH | CENTER FREQUENCY |
|---|---|---|---|
| 1 | 26.965 | 20 | 27.205 |
| 2 | 26.975 | 21 | 27.215 |
| 3 | 26.985 | 22 | 27.225 |
| X | 26.995 | 24 | 27.235 |
| 4 | 27.005 | 25 | 27.245 |
| 5 | 27.015 | 23 | 27.255 |
| 6 | 27.025 | 26 | 27.265 |
| 7 | 27.035 | 27 | 27.275 |
| X | 27.045 | 28 | 27.285 |
| 8 | 27.055 | 29 | 27.295 |
| 9 | 27.065 | 30 | 27.305 |
| 10 | 27.075 | 31 | 27.315 |
| 11 | 27.085 | 32 | 27.325 |
| X | 27.095 | 33 | 27.335 |
| 12 | 27.105 | 34 | 37.345 |
| 13 | 27.115 | 35 | 27.355 |
| 14 | 27.125 | 36 | 27.365 |
| 15 | 27.135 | 37 | 27.375 |
| X | 27.145 | 38 | 27.385 |
| 16 | 27.155 | 39 | 27.395 |
| 17 | 27.165 | 40 | 27.405 |
| 18 | 27.175 | | |
| 19 | 27.185 | | |
| X | 27.195 | | |

TABLE II

| CH | $f_{sl}$ | CH | $f_{sl}$ |
|---|---|---|---|
| 1 | 23.840 | 20 | 24.080 |
| 2 | 23.850 | 21 | 24.090 |
| 3 | 23.860 | 22 | 24.100 |
| X | 23.870 | 24 | 24.110 |
| 4 | 23.880 | 25 | 24.120 |
| 5 | 23.890 | 23 | 24.130 |
| 6 | 23.900 | 26 | 24.140 |
| 7 | 23.910 | 27 | 24.150 |
| X | 23.920 | 28 | 24.160 |
| 8 | 23.930 | 29 | 24.170 |
| 9 | 23.940 | 30 | 24.180 |
| 10 | 23.950 | 31 | 24.190 |
| 11 | 23.960 | 32 | 24.200 |
| X | 23.970 | 33 | 24.210 |
| 12 | 23.980 | 34 | 24.220 |
| 13 | 23.990 | 35 | 24.230 |
| 14 | 24.000 | 36 | 24.240 |

TABLE II-continued

| CH | $f_{sl}$ | CH | $f_{sl}$ |
|---|---|---|---|
| 15 | 24.010 | 37 | 24.250 |
| X | 24.020 | 38 | 24.260 |
| 16 | 24.030 | 39 | 24.270 |
| 17 | 24.040 | 40 | 24.280 |
| 18 | 24.050 | | |
| 19 | 24.060 | | |
| X | 24.070 | | |

Lead 101 couples to the signal input of a mixer 200 which has an output lead 201 and signals S3 are generated thereon. Mixer 200 also has an input lead 202 for receiving clock signals of the first selectable frequency $f_{s1}$. The frequency $f_{s1}$ is chosen to equal the difference between the center frequency of the selected AM channel and the quantity 3.125 MHz. Mixer 200 generates signals S3 by mixing signal S2 with frequency $f_{s1}$, and thus the selected AM channel is centered at the frequency 3.125 MHz. This fact is illustrated in FIG. 3c. TABLE II lists the value of frequency $f_{s1}$ along side of the number of the selected AM channel.

Lead 201 couples to a second mixer 300. Mixer 300 has a clock input lead 301 and an output lead 302. A clocking signal of 3.58 mHz is applied to lead 301. Mixer 300 mixes signals S3 with the signal on lead 301 and, in response thereto, generates signals S4 on lead 302. As a result of the mixing operation, the selected AM channel in S4 is centered at frequency 455 kHz. FIG. 3d illustrates signal S4.

Signal S4 passes through a noise blanker 400, and noise blanker 400 is serially coupled to an amplifier 500. Signals S5 and S6 are generated by noise blanker 400 and amplifier 500, respectively. In general, the function of noise blanker 400 and amplifier 500 is to filter and amplify signal S4, but not to frequency shift signal S4. Thus, the center frequency of the selected channel is present in signal S6 at 455 kHz. Signal S6 is illustrated in the frequency domain in FIG. 3e.

In the receive mode, a switch 600 couples signals S6 to the input of a charge transfer device filter 700 via a lead 701. Charge transfer device filter 700 also has a clocking lead 702 for receiving clocking signals of a second selectable frequency $f_{s2}$. In response to the frequency $f_{s2}$, filter 700 generates output signals S8 on a lead 703.

In the preferred embodiment, charge transfer device filter 700 is a charge coupled device (CCD) transversal filter having a plurality of passbands which are programmable by varying the selectable frequency $f_{s2}$. Copending application, Ser. No. 758,366, entitled, "Frequency Converting Filter," by Jerry Norris and Clinton Hartmann, filed January, 1977, assigned to the same assignee of this application, contains a detailed description of its construction. Basically, the charge coupled device transversal filter is comprised of a plurality of serially connected stages having a split electrode structure defining an impulse response of the form (sine N/N) (cosine $2\pi f_0 N$). In this expression, the frequency $f_0$ equals $1/(N_0 \times t_s)$ where the quantity $1/t_s$ equals the selectable frequency $f_{s2}$, and $N_0$ is the number of stages over which the term cosine ($2\pi f_0 t$) completes one cycle. The bandwidth $\Delta f$ of each of the passbands equals $1/(t_s N_1)$ where the quantity $1/t_s$ again equals the selectable sampling frequency $f_{s2}$, and $N_1$ equals the number of stages in which the term (sine N)/N passes before reaching its first zero crossing. Copending application, Ser. No. 758,365, entitled, "Programmable Frequency Converting Filter," by Lawrence Reagan, filed Jan. 5, 1977, assigned to the same assignee of this application, describes how the passbands of a charge transfer device transversal filter are programmed in response to a clocking frequency.

In one preferred embodiment, the parameters $N_0$ and $N_1$ are chosen such that the passbands of filter 700 have a center frequency of N $\times$ $f_{s2} \pm 1/4 f_{s2}$, and the bandwidth of filter 700 equals $1/20 f_{s2}$. FIG. 3f illustrates the frequency response of the charge coupled device filter having the above described characteristics. The function of the filter 700 is to receive signals S7 on lead 701, to filter a selected one of the channels (either AM or sideband) from the plurality of channels comprising signal S7, and to frequency shift the selected channel down in frequency.

If the selected channel is a single sideband channel, the channel has a width of approximately 5 kHz and thus filter 700 is clocked with a frequency $f_{s2}$ such that its passbands are approximately 5 kHz wide. In other words, the quantity $1/20 f_{s2}$ approximately equals 5 kHz when the selected channel is a single sideband channel. Additionally, the frequency $f_{s2}$ is chosen such that one of the multiple passbands of filter 700 aligns with the sideband channel to be selected from S7. In the preferred embodiment, the passband of filter 700 that is centered at $5f_{s2} + \frac{1}{4}f_{s2}$ is aligned with the sideband channel selected from signal S7. This is filter 700's eleventh passband. As illustrated in Table IIIa, a frequency $f_{s2}$ equal to 86,409 Hz aligns the center of the eleventh passband of filter 700 with frequency 450 kHz. And a clocking frequency $f_{s2}$ of 86,932 Hz aligns the center of the eleventh passband of filter 700 at 460 kHz. The width of both of these passbands is approximately 5 kHz. FIG. 3E1 is a blow up of signal S7 about the frequency of 455 kHz, and FIG. 3F1 is a blow up of FIG. 3F about the same frequency. Together, these figures illustrate the alignment of the eleventh passband of filters 700 with the selected channel. It should also be noted, as illustrated in FIG. 3E1, that the mixing operation of mixer 300 results in the flip-flopping in frequency of the upper and lower sideband channels. This flip-flopping occurs because the mixing frequency of 3.58 mHz is higher than the center frequency of the selected AM channel, i.e., 3.125 mHz.

The clocking frequency $f_{s2}$ is also chosen such that filter 700 has bandwidths of approximately 10 kHz, one of which is centered about the frequency of 455 kHz. Such a characteristic is used to pass an AM signal centered about 455 kHz. Table IIIb illustrates that a clocking frequency $f_{s2}$ equal to 202,218 Hz causes filter 700 to have its passband centered at 455 kHz and a bandwidth of approximately 10 kHz. This situation is also illustrated in FIGS. 3E1 and 3F1.

TabLE IIIa

| $\frac{1}{20} f_{s2}$ | $5f_{s2} + \frac{1}{4} f_{s2}$ | $f_{s2}$ |
|---|---|---|
| 5 kHz | 450 kHz | 86,409 Hz |
| 5 kHz | 460 kHz | 86,932 Hz |

TABLE IIIb

| $\frac{1}{20} f_{s2}$ | $2f_{s2} + \frac{1}{4} f_{s2}$ | $f_{s2}$ |
|---|---|---|
| 10 kHz | 455 kHz | 202,218 Hz |

Lead 703 couples the output of CCD filter 700 to an amplifier 800. Amplifier 800 is tuned to pass only those frequencies lying within the first passband of CCD filter 700. That is, amplifier 800 only passes frequencies lying about $\frac{1}{4} f_{s2}$. Amplifier 800 has an output lead 801 and signals S9 are generated thereon. FIG. 3G illustrates signal S9 on the same frequency scale as FIG. 3F (which illustrates the passbands of filter 700); and FIG. 3H illustrates signal S9 on an expanded frequency scale so that its characteristics are more apparent. In FIG. 3H, the signal S9 is illustrated as lower sideband channel L2 as an example.

Signal S9 is coupled to a demodulator 900 via the lead 801. Demodulator 900 functions to shift signals S9 in frequency to the audio range. When sideband signals are received, this shift in frequency is accomplished by time sampling signal S9 at a third selectable $f_{s3}$. Time sampling equals convolution in the frequency domain. FIG. 3I illustrates the frequency components of a sampling transfer function H2 which samples at a frequency $f_{s3}$ and FIG. 3J illustrates the convolution of signal S9 with transfer function H2. This convolution signal is labeled S10 and is generated on a lead 901.

In order to properly shift signal S9 to the audio frequency range by the convolution operation, it is necessary that the frequency $f_{s3}$ be carefully aligned frequencies of S9. When signal S9 is a lower sideband, frequency $f_{s3}$ is chosen to align with the lowest frequency present. Thus, in FIG. 3H, frequency $f_{s3}$ lies to the left of the quantity $f_{s2}/4$, and nominally is 20.346 kHz.

One difficulty in receiving single sideband signals is that they have no carrier to lock onto. Thus, the exact position in frequency of the signal S9 is unknown. All that is known is that the signal lies somewhere within its assigned 5kHz channel; and therefore a problem exists in being able to align frequency $f_{s3}$ with signal S9 regardless of where the latter lies within its channel. The tone quality of the resulting audible signal is directly related to how well frequency $f_{s3}$ and signal S9 are aligned. Elements 3200–3500 provide a means for incrementally adjusting frequency $f_{s3}$ so as to be properly aligned with signal S9 regardless of where it lies within its 5-kHz channel.

As described above, amplitude modulated signals may also be received. In that case, frequency $f_{s2}$ equals 202,218; and therefore signal S9 which is centered at $f_{s2}/4$ has a center frequency of 50.555 KHz. Demodulator 900 shifts this signal to the audio range by a standard diode envelope detector which does not require a third sampling frequency.

Signal S10 couples via lead 901 to volume control unit 1000. Volume control unit 1000 has an output lead 1001 and signals S11 are generated thereon. Lead 1001 couples to an audio amplifier 1100 which has an output lead 1101 and signals S12 are generated thereon. Lead 1101 is coupled to a speaker 30 where the signals S12 shown in FIG. 3 are converted to audible sounds.

Mixer 200 is illustrated in detail in FIG. 4A. Basically, mixer 200 is comprised of a dual gate MOSFET 210. One of the dual gates couples to signal S2 via lead 101, and the other gate couples to signal S202 via lead 202. The conductance of FET 210 is proportional to the product of the signals on its two gates. Signal S3 on lead 201 is generated at the source of FET 210, and thus it equals the product of signals S2 and S202. A tank circuit 211 having a resonant frequency of 3.125 mHz couples to lead 201. A logic signal FEO couples to the drain of FET 210 through a 10-K resistor 212. When signal FEO is at a high voltage, the gain of mixer 200 increases; whereas, when signal FEO is low, the gain of mixer 200 decreases. Signal FEO is thus utilized to logically step the gain of mixer 200 by approximately 40 dB.

FIG. 4B is a detailed circuit diagram of mixer 300. Mixer 300 is also comprised of a dual gate MOSFET 310. One of the dual gates couples to signal S3 via lead 201, and the other gate couples to signal S301 via lead 301. A bias circuit 312 couples lead 201 to minus 8 volts. A tank circuit 311, having a resonant frequency of 455 kHz, serially couples ten-volts to the source of FET 310 where signal S4 on lead 302 is generated.

Figure 4C:
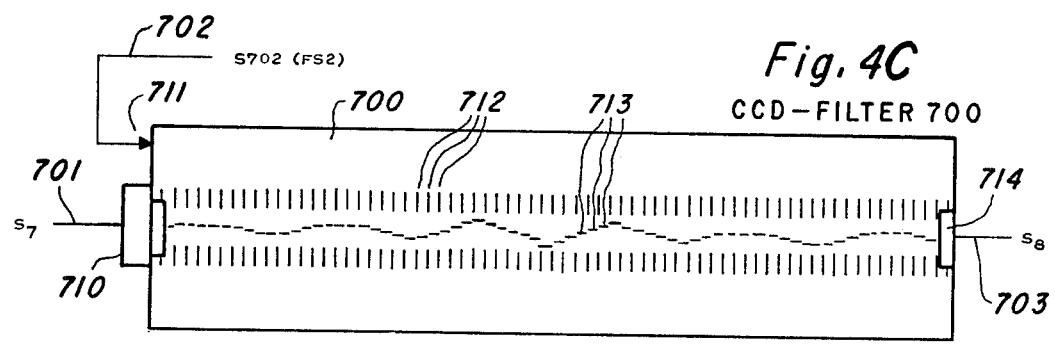

FIG. 4C is a greatly enlarged top view of CCD transversal filter 700. Lead 701 couples to an input stage 710 of filter 700. Lead 702, carrying clocking signals of the second selectable frequency $f_{s2}$, couples to the clocking input 711 of filter 700. As previously described, filter 700 is comprised of a plurality of serially-connected stages 712; and each of the stages has a split electrode. These splits 713 have a profile of the form (sine N/N) (cosine $2\pi f_0 N$). This structure has a plurality of passbands centered about multiples of the frequency $f_{s2}$ as previously described. Lead 703 couples to an output stage 714 of filter 700, and the signals S8 are generated thereon.

Figure 4D:
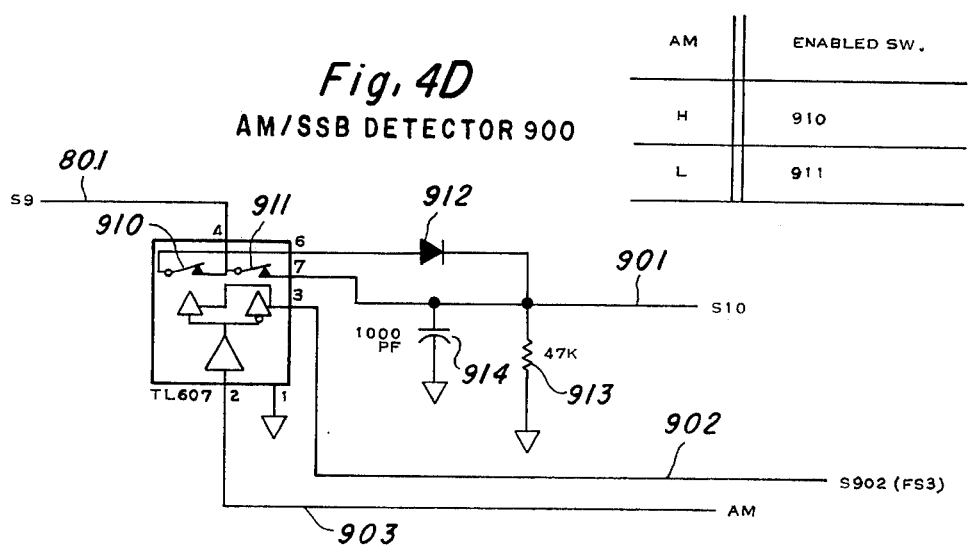

Detector 900 is illustrated in FIG. 4D. Basically, detector 900 is comprised two logically-controlled switches 910 and 911 having a common input coupled to lead 801. Logic control inputs, coupled to leads 902 and 903 are provided for logically controlling the operation of switches 910 and 911. Texas Instruments part number TL607 is an example of such a switch. A logic signal AM is applied to lead 903, and signal S902 comprised of the third selectable frequency $f_{s3}$ is applied to lead 902. Switch 910 is permitted to be closed when signal AM is at a high voltage level, while switch 911 is permitted to be closed when signal AM is at a low voltage level. The actual closure of switch 910 and 911 is determined by signal S902. When amplitude-modulated signals are received, signal AM and signal S902 are both at a high voltage level, and thus, signal S9 passes through switch 910. The output of switch 910 is coupled to a diode 912 and a low-pass filter comprised of circuit elements 913 and 914. Lead 901 couples to the output of the low-pass filter. Conversely, when single sideband signals are received, signal AM is at a low voltage level and signal S902 contains the third selectable frequency $f_{s3}$. Thus, switch 911 opens and closes in response to frequency $f_{s3}$. This sampling operation shifts signal S9 down in frequency as was illustrated in FIGS. 3H–3J. The output of switch S9 couples to the low-pass filter and to lead 901.

As the preceding description indicates, the operation of the transceiver of FIG. 2 is dependent upon the proper generation of three selectable frequencies $f_{s1}$, $f_{s2}$, and $f_{s3}$. The clocking means for generating these frequencies will now be described. FIG. 2 illustrates these clocking means in block diagram form. They are comprised of clocking modules 3000, 3100, and 3200. Basically, module 3000 generates signal S301 which is comprised of a fixed frequency of 3.58 mHz. Module 3000 also generates signals S3004 and S3005 on leads 3004 and 3005, respectively. Lead 3004 couples to module 3100, which in response to S3004 generates signals S202 comprised of frequency $f_{s1}$. Lead 3005 couples to module 3200 which receives signals S3005 and, in response thereto, generates signals S702 and S902 comprised of frequencies $f_{s2}$ and $f_{s3}$, respectively.

The selectable frequencies $f_{s1}$, $f_{s2}$, $f_{s3}$ are generated by modules 3000 and 3200 as multiples of 3.58 mHz. These multiples are designated as $N_1$–$N_6$ in FIG. 2. Some of the multiples are fixed, while other multiples are programmable. TABLE IV lists the selectable frequencies $f_{s1}$, $f_{s2}$, $f_{s3}$ along with the multiples $N_1$–$N_6$ and the intermediate clocking signals S3004 and S3005 as a function of the particular single sideband channel or AM channel that is to be received.

TABLE IV

|  | SSB-CH | | | | AM-CH | |
| --- | --- | --- | --- | --- | --- | --- |
|  | 1L | 1U | 2L | 2U | 1 | 2 |
| osc | 3,58MHZ | | | | | → |
| $f_{s1}$ | 23,84MHZ | 23,84MHZ | 23,85MHZ | 23,85MHZ | 23,84MHZ | 23,85MHZ |
| $N_2$ | 1432 | | | | | → |
| S3004 | 2.5KHZ | | | | | → |
| $N_1$ | 9,536 | | 9,540 | | 9,536 | 9,540 |
| $f_{s2}$ | 86,932Hz | 86,409Hz | 86,932HZ | 86,409HZ | 202,218HZ | |
| $N_3$ | 10 | | | | | → |
| S3005 | 250HZ | | | | | → |
| $N_4$ | 55 | | | | 24 | → |
| $N_5$ | 19,125 | 19,010 | 19,125 | 19,010 | 19,413 | 19,413 |
| $f_{s3}$ | 20,345HZ | 22,959HZ | 20,245HZ | 22,959HZ | H | H |
| $N_6$ | 235 | 207 | 235 | 207 | X | X |

Some of the information in TABLE IV can be correlated with the preceding description. Compare, for example, the $f_{s1}$ frequency listings of TABLE II, with the entries in TABLE IV. Also compare the TABLE III entries of $f_{s2}$, with the TABLE IV entries of $f_{s2}$. And further compare the demodulating clocking frequency $f_{s3}$ of FIGS. 3I and 3I1 with the $f_{s3}$ entries in TABLE IV.

Given the values of $f_{s1}$, $f_{s2}$ and $f_{s3}$ as listed in TABLE IV, $N_1$–$N_6$ must be chosen such that the desired frequencies are obtained. To this end, multiplier $N_2$ is chosen to be 1432. Thus, signal S3004 is a fixed frequency of 2.4 kHz. Accordingly, a selectable frequency $f_{s1}$ of 23.84 kHz is obtained by setting $N_1$ to 9,536 or 9,540, respectively.

As TABLE IV further illustrates, the multiplier $N_3$ is fixed at a value of 10. Thus, signal S3005 is a fixed frequency of 250 Hz. And therefore, selectable frequency $f_{s2}$ becomes 86,932 (as required to receive lower sideband signals) when multiplier $N_5$ equals 19,125. Similarly, frequency $f_{s2}$ equals 86,409 or 202,218 when multiplier $N_5$ equals 19,010 or 19,413, respectively.

Selectable frequency $f_{s3}$ is generated by appropriately choosing $N_6$. As illustrated in TABLE IV, frequency $f_{s3}$ is suitable for demodulating lower sideband channels when $N_6$ equals 235, and is suitable for demodulating upper sideband channels when multiplier $N_6$ equals 207.

As the preceding description pointed out, sideband signals may lie anywhere within their assigned 5-kHz channel, and thus it is desirable to control the selectable frequency $f_{s2}$ in fine increments. TABLE IV implies how this fine incremental control is obtained. Signal S3005 has a fixed frequency of 250 hertz and multiplier $N_4$ is fixed at 55. This produces a frequency of 250 Hz/55 or approximately 5 Hz. Thus, by constructing multiplier $N_5$ as a programmable multiplier, frequency $f_{s2}$ is controllable in increments of approximately 5 Hz.

Figure 5:
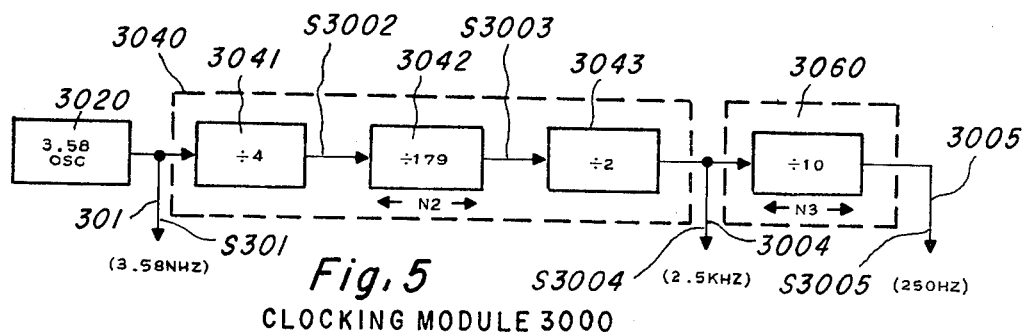
FIG. 5 is a detailed circuit diagram of a clocking module 3000 included within FIG. 2.

FIGS. 5–8 illustrate the details of clocking modules 3000–3200. Referring first to FIG. 5, the details of clocking module 3000 are therein illustrated. Clocking module 3000 is comprised of a 3.58 mHz oscillator 3,020, a divide by $N_2$ logic circuit 3040 and divide by 10 logic circuit 3060. This configuration is illustrated in block diagram form in FIG. 5a.

FIG. 6A is a block diagram illustrating the major components comprising clocking module 3100, while FIGS. 6b–6d are detailed circuit diagrams of the most complex components. As illustrated in FIG. 6a, clocking module 3100 is implemented by means of a phase lock loop. The phase lock loop is comprised of a phase detector 3120, a voltage controlled oscillator (VCO) 3140, and a programmable counter 3160. Phase detector 3120 has a first input coupled to lead 3004 and a second input coupled to an output of programmable counter 3160 via a lead 3161. A lead 3121 couples an output of phase detector 3120 to an input of VCO 3140. Lead 202 couples an output of VCO 3140 to an input of counter 3160 thereby completing the phase locked loop.

Phase detector 3120 is illustrated in detail in FIG. 6B. It includes a logic gate 3122 having an input coupled to lead 3004 and an output coupled to an RC ramp generating circuit 3123. An operational amplifier 3124 is provided to buffer the output of the ramp generating circuit 3123. A logically-controlled switch 3125 has a signal input which couples to an output of operational amplifier 3124, and a logical control input which couples to a lead 3161. An output of switch 3125 couples to a holding capacitor 3126, and to the input of an operational amplifier 3127. Lead 3121 couples to an output of operational amplifier 3127. In this configuration, signal S3004 causes a ramp signal to be generated at the output of operational amplifier 3124, and switch 3125 samples the ramp signal in response to signal S3161. The sample is stored in holding capacitor 3126 and buffered by operational amplifier 3127. Thus, signal S3121 has a magnitude which reflects the phase difference between signals S3004 and S3161.

FIG. 6C is a detailed circuit diagram of VCO 3140. As therein illustrated, the VCO is comprised basically of a dual gate MOS-FET 3141 having one gate coupled to a biasing network 3142, and having a second gate coupled to a tuned circuit 3143. The tuned circuit includes a vari-cap 3144 which has a capacitance proportional to the voltage applied across its terminals. Thus, the resonant frequency of the circuit 3143 is dependent upon the voltage applied across vari-cap 3144. Signal S3121 is coupled to the vari-cap, and therefore, the oscillating frequency of circuit 3143 is responsive to the magnitude of that signal. The source of FET 3141 is coupled to a buffering transistor 3145. Lead 202 couples to the collector of transistor 3145, and signals S202, having the first selectable frequency, are generated thereon.

Counter 3160 is comprised of a fixed divide-by-four counter 3162, and programmable 12-bit counter 3163. Lead 202 couples to the input of divide-by-four counter, and a lead 3164 couples the divide-by-four counter output to the programmable 12-bit counter input. FIG. 6D is a detailed logic diagram of the 12-bit counter 3163. It is basically constructed of three 4-bit counters 3165–3167. Each of these counters is identical in construction to the previously-described counters 3044 and 3045. Counters 3165–3167 are serially coupled together to form one 12-bit counter. Programmable logic signals A0–A5 are supplied to the least significant six inputs of counter 3163 via lead 3401. Inputs to the most significant six bits of counter 3163 are fixed at either a 1 or a 0 logic level. Utilizing this configuration, counter 3163 has a programmable count defined in binary as 100100XXXXXX. The complement of this count is loaded into counter 3163 when its carryout is true. Logic gates 3168 are coupled to provide the necessary control signals on the LD inputs of counters 3165–3167.

FIG. 6E is a detailed circuit diagram, of an alternative embodiment of phase detector 3120. The phase detector has a reference clock input lead 3004, a sampling clock input lead 3161, and a phase detection output lead 3121. Reference clock signals S3004 are received on input lead 3004, and sampling clock signals S3161 are received on input lead 3161. In response thereto, phase detection signals S3121 are generated on lead 3121. The phase detection signals are analog signals having a magnitude which reflect the difference in phase between the reference clock and sampling clock signal. More specifically, signal S3121 has a quiescent value when the signals S3004 and S3161 are exactly in phase. On the other hand, signal S3121 has a value larger than the quiescent value when signal S3161 lags in phase from signal S3004. Similarly, signal S3121 has a magnitude smaller than the quiescent value when signal S3161 leads in phase with respect to signal S3004.

The phase detector of FIG. 6E is comprised basically of a variable-period sawtooth generator 3130 and a sample-and-hold circuit 3131. Variable-period sawtooth generator 3130 receives the reference clock signals on lead 3004, and in response thereto, generates sawtooth-shaped signals $st_1(t)$ and $st_2(t)$ having the same period as the reference signals. Signal $st_1(t)$ is generated on a node 3132, and is buffered to node 3133 as signal $st_2(t)$. Sample-and-hold circuit 3131 receives signal $st_2(t)$ on lead 3134 and, simultaneously, receives signal S3161 on lead 3161. Signal S3161 has a "sampling state" corresponding to the high voltage level, and a "non-sampling state" corresponding to a low voltage level. When signal S3161 is in the sampling state, sample-and-hold circuit 3131 samples sawtooth signal $st_2(t)$ and generates phase detection signal S3121 on lead 3121 with a magnitude proportional to the magnitude of the sample. Conversely, when signal S3161 is in the non-sampling state, sample-and-hold circuit 3131 does not sample signal $st_2(t)$, but simply holds the preceeding sample, and continues to generate signal S3121 with a magnitude proportional to the last sample taken.

Basically, variable-period sawtooth generator 3130 consists of an RC timing network 3135 coupled to a buffer circuit 3136. R-C timing circuit 3135 consists of a MOS load transistor 3135a coupled in series with a capacitor 3135b. This series connection forms node 3132. The gate of transistor 3135a couples to its drain. Thus, transistor 3135a operates in the depletion mode to provide a high-resistance path through which capacitor 3135b is charged. A MOS switching transistor 3135c is coupled in parallel with capacitor 3135b. The gate of transistor 3135c couples to lead 3004. Thus, transistor 3135c is selectively turned on or off by reference clock signal S3004.

Buffer circuit 3136 is comprised of a MOS load transistor 3136a coupled in series with a source transistor 3136b. This series connection forms node 3133. The gate of transistor 3136b couples to its source; and the gate of transistor 3136a couples by a lead to node 3132. Lead 3134 couples to the serial connection between transistor 3136a and 3136b, and signal $s_2(t)$ is generated thereon.

Sample-and-hold circuit 3131 is composed of a load transistor 3131a serially connected to a source transistor 3131b. The gate of load transistor 3131a couples to its drain. Thus, load transistor 3131a operates in the depletion load to provide a high-resistance path to transistor 3131b. Lead 13 couples to the serial connection between transistors 3131a and 3131b, and signal S3121 is generated thereon. The gate of transistor 3131b couples to the source of a transistor 3131c. Lead 3134 couples to the drain of transistor 3131c, and lead 3161 carrying signal 53161 couples to the drain of transistor 3131c.

The operation of the structure of FIG. 6E is illustrated by the voltage-timing diagrams of FIG. 6F. In particular, FIG. 6F1 illustrates signal S3004. During a time interval $\Delta t_1$, signal S3004 is at a high voltage state, and transistor 3135c turns on in response thereto. In this time interval, transistor 3135c provides a low impedance path across capacitor 3135b. Consequently, capacitor 3135b quickly discharges to ground forcing signal $S_1(t)$ to near zero voltage, as illustrated in FIG. 6F2.

Conversely, during a time interval $\Delta t_2$, signal S3004 is in a low voltage state. Transistor 3135c turns off in response to this low voltage, and consequently, capacitor 3135b charges in a ramp-type manner through transistor 3135a. Due to this charging action, the voltage across capacitor 3135b continues to rise until reference clock signal S3004 is switched to the high voltage state or until the voltage on node 3132 reaches Vdd. When the former occurs, capacitor 3135b will again discharge. The time intervals $\Delta t_1$ and $\Delta t_2$ are alternately repeated; and thus, signals $s_1(t)$ and signal $s_2(t)$ have a sawtooth-shaped waveform, as illustrated in FIG. 6F2.

The operation of sample-and-hold circuit 3131 is also illustrated in FIG. 6F. In particular, FIG. 6F3 illustrates signal S3161 which has a high voltage state and a low voltage state. Transistor 3131c, of the sample-and-hold circuit, turns off in response to signal S3161 being in a low-voltage state, and turns on in response to signal S3161 being in a high-voltage state. Thus, a high voltage signal 3161 transfers the voltage on lead 3134 to the gate of transistor 3131b. Conversely, a low voltage signal S3161 isolates the gate of transistor 3131b from lead 3134. Since no discharge path is provided for the gate of transistor 3131b, the voltage there remains held in the Miller capacitance 3131d of transistor 3131b until the next sample is taken.

The above-described sample-and-hold operation is illustrated in FIGS. 6F3 and 6F4. As therein illustrated, at a time $t_1$, signal S3161 goes high for a short period of time; and in response thereto, circuit 3131 samples the voltage on lead 3134. The value of this sample, designated $S3121(t_1)$ is held in capacitor 3131d and reflected on output lead 3121 until the next sample is taken. The sample at time $t_1$ is illustrated in FIG. 6F4 as having occurred in the center of the charging period $\Delta t_2$. The fact that this sample occurs late in the $\Delta t_2$ period is reflected by the amplitude of the sample taken and the signal $53121(t_2)$. In particular, the amplitude of this second sample will be greater than the amplitude of the preceeding sample; and the difference is proportional to the amount of phase difference between signals S3004 and S3161 at time $t_2$.

FIG. 6F also illustrates a sample taken at time $t_3$ which occurs earlier than midway through the sampling period $\Delta t_2$. The sawtooth-shaped signal $s_2(t)$ has a relatively small amplitude when this sample is taken. Thus, the output signal $S3121(t_3)$ has a smaller amplitude than the signal $S3121(t_1)$. And this difference is proportional to the phase difference between signals S3004 and S3161 at time $t_3$.

Note that the clocking means herein described utilizes only a single reference frequency (single crystal oscillator) from which all of the mixing frequencies and modulating frequencies are derived. This clocking means may also be utilized in transceivers which perform the sideband filtering with crystal filters. Such a crystal filter is described, for example, in the *Radio Amateur's Handbook* on pages 414–419, published by the American Radio Relay Leaque in 1976. The crystal filter therein described would replace charge coupled device filter 700, and the frequency shifting performed by filter 700 would be performed by altering frequencies $f_{s1}$, $f_{s3}$, or by adding an additional mixer.

A block diagram of clocking module 3200 is illustrated in FIG. 7A. As therein illustrated, the N5 factor is implemented by means of a phase lock loop. This loop is similar in structure to the phase lock loop which was utilized to implement the N1 factor as described in FIG. 6. The phase lock loop in FIG. 7 is comprised of a phase detector 3220, a VC0 3230, and a 16-bit programmable counter 3240. Phase detector 3220 has a first signal input coupled to lead 3005 for receiving signals having reference frequency of 250 Hz, and a second input coupled to lead 3241 for receiving signals generated by counter 3240. The output of phase detector 3220 is coupled via a lead 3221 to an input of VCO 3230. A lead 3231 couples an output of VCO 3230 to an input of counter 3240, thereby completing the loop.

FIG. 7B is a logic diagram illustrating the details of the 16-bit programmable counter 3240. Basically, it is comprised of four, 4-bit up counters 3250–3253, which are identical in construction to the previously-described 4-bit up counters, 3044 and 3045. Counters 3250–3253 are serially coupled together to form one 16-bit counter. The least significant nine input bits of counter 3240 receive programmable logic signals A8–A15 via leads 3402. The most significant seven input bits of counter are coupled to a fixed 1 or 0 logic level. The carryout of counter 3253 is coupled via logic gates 3254 to provide the necessary control signals to the LD inputs of counters 3250–3253.

Lead 3231 also couples to a divide by N4 counter 3260. A detailed logic circuit diagram of counter 3260 is illustrated in FIG. 7C. Counter 3260 selectively divides by 55 or 24 dependent upon the state of logic signal A7 which it receives via one of the leads 3402. When signal A7 is a high voltage level, the ones complement of 24 is applied to the inputs of counter 3260; and when signal A7 is a low voltage level, the ones complement of 55 is applied to the inputs of the counter. Two 4-bit counters, 3265 and 3266, having a construction identical to counters 3044 and 3045 are utilized to implement counter 3260. Logic gates 3267 provide the means for generating control signals on the LD inputs 3265 and 3266.

FIG. 8 illustrates the details of the divide-by-N6 counter which is utilized to generate the third selectable frequency $f_{s3}$. As therein illustrated, the divide N6 counter 3280 is similar in construction to the previously-described counters. The data inputs of these counters are selectively set to be the ones complement of 235 when the logic signal A6 is high, and the ones complement of 207 when the logic signal A6 is low. A logic signal S902 comprised of the third selectable frequency $f_{s3}$ is generated thereby.

Figure 9:
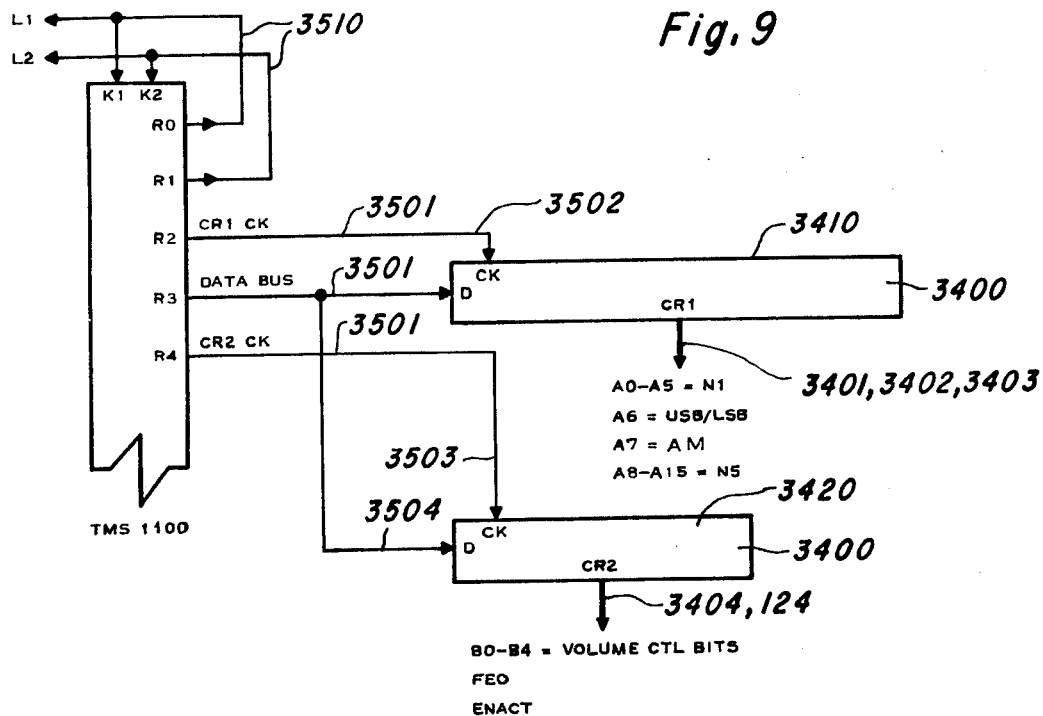
FIG. 9 is a circuit diagram illustrating the source of logic signals which are utilized by clocking modules 3000-3200 of FIGS. 5-8.

Referring now to FIG. 9, the source of the logic signals which are generated to specify the value of multipliers N1, N4, N5, and N6, and to operate volume control unit 1000 is therein illustrated. The source of these logic signals includes two logic registers 3400. One of the registers 3410 is a 16-bit register, and it has outputs coupled to leads 3401, 3402, and 3403. Output bits 0-6 of register 3410 are coupled to lead 3401 and signals A0–A6 are generated thereon. Output bits 7–15 of register 3410 are coupled to leads 3402 and signals A7–A15 are generated thereon. Output 3410 is coupled to lead 3403 to generate signal A6.

The second register 3420 is a seven-bit register. It has output bits 0-4 coupled to leads 3404 to thereby provide the volume control logic signals B0–B4. Bit 5 of register 3240 is coupled to lead 124 to provide previously described logic signal FEO. Bit 6 of register 3240 provides a logic signal ENACT (enable auto call transmit) the function of which is described later in conjunction with transmit.

Registers 3410 and 3420 are comprised of D-type flip flops. A microprocessor 3500 is utilized to provide data and clocking input signals for both of these registers over leads 3501. This data constitutes microcommands which are interpreted and responded to by circuits coupled to the register outputs. In one embodiment, microprocessor 3500 is comprised of a TMS1100 which is manufactured by Texas Instruments Incorporated. Details of the TMS1100 are given in the publication entitled, "Programmers Reference Manual for the TMS 1000 Series MOS/LSI One-Chip Microcomputers." The publication is published and made available through Texas Instruments Incorporated. See also U.S. Pat. No. 3,991,305, by inventors Caudel et al assigned to Texas Instruments Incorporated.

The TMS1100 includes an 11-bit output register having bits labeled R0–R10. As illustrated in FIG. 9, bit R2 is coupled to the clocking input of register 3410 via a lead 3502, and a clocking signal CR1CK is generated thereon. Similarly, bit R4 is coupled to the clocking input of register 3420 via a lead 3503, and a clocking signal CR2CK is generated thereon. Bit R3 is coupled to the data inputs of registers 3410 and 3420 via lead 3504, and a data signal called DATABUS is generated thereon.

The TMS1100 also includes a 4 bit input register having inputs K1, K2, K4, and K8. Inputs K1 and K2 are coupled to control unit 40 via leads 3510 to provide a means by which microprocessor 3500 receives control signals L1 and L2 from the control unit. In response to signals L1 and L2, microprocessor 3500 generates the logic signals CR1CK, CR2CK, and DATABUSto thereby specify the appropriate multipliers N1-N6 and the appropriate volume control bits. Signals L1 and L2 are described infra.

Several modifications to the above-described receive circuitry of the transceiver of FIG. 2 may be made without departing from the inventive concepts disclosed therein. For example, a microprocessor other than the TMS1100 may be utilized to receive control signals via leads 3510 and in response thereto to generate data and clocking signals for registers 3400. A TMS1000 or a TMS1200 may be utilized to replace the TMS1100 as an example. In addition, the counters comprising clocking modules 3000-3200 In addition, the counters comprising clocking modules 3000-3200 may be implemented with circuits other than those illustrated in FIGS. 5-8. For example, the programmable counters may be implemented with down-counters rather than up-counters, in which case the actual number to be counted, rather than its complement, would be applied to the data inputs of the counter. Further, CCD filter 700 may be constructed to have passbands centered about the frequencies $nf_{s2} \pm kf_{s2}$ where k is not equal to $\frac{1}{4}$. For example, k could equal $\frac{1}{8}$, in which case the values of N1-N6 would be scaled appropriately.

Figure 10:
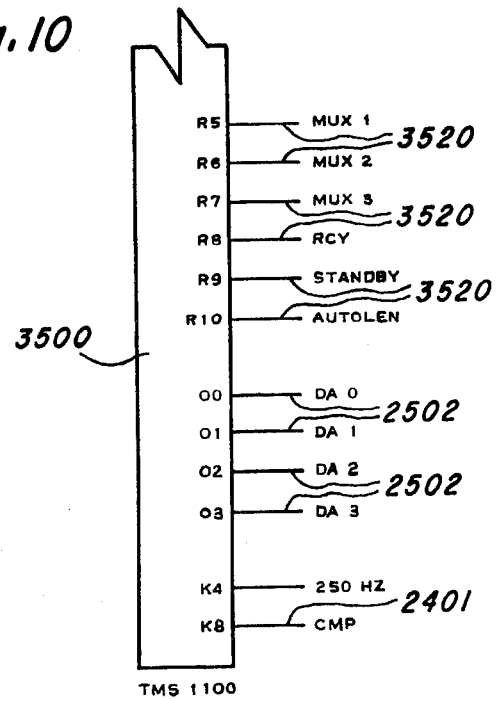
FIG. 10 is a block diagram of a micro computer which forms a portion of the circuit of FIG. 9.

Referring now to FIG. 10 a block diagram of that portion of the TMS1100 which was not included in FIG. 9 is therein illustrated. Input register bit K4 is coupled to receive a logic signal 250Hz, and input register bit K8 is coupled to receive a logic signal CMP. Further, output bits R5-R10 are the source of logic signals MUX1, MUX2, MUX3, RCV, STANDBY and AUTOLEN, respectively. These signals are microcommands to the circuits which receive them. Signal RCV is utilized to control switch 600. In addition, the TMS100 has a second output register having output bits 00, 01, 02, and 03 which generate logic signals (microcommands), DA0, DA1, DA2, and DA3, respectively.

Figure 11:
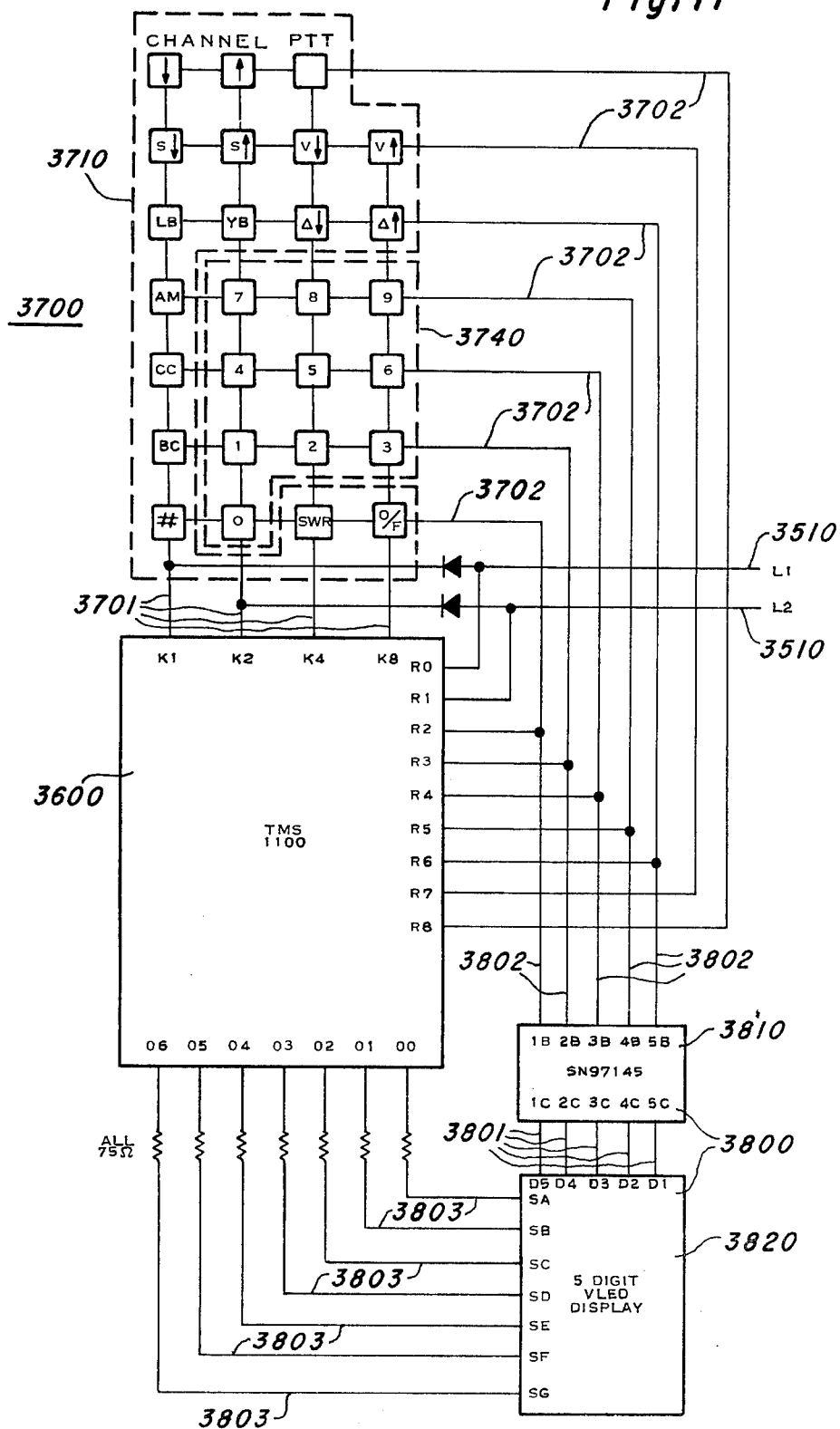
FIG. 11 is a detailed schematic diagram of the control unit included within FIG. 2.

The means for manually operating the transceiver of FIG. 2 will now be described in conjunction with FIG. 11. FIG. 11 is a detailed schematic diagram of keyboard 3700, display 3800, and microprocessor 3600, all of which are included within control head 40. In general, each operation which the transceiver performs is initiated via keyboard 3700.

Keyboard 3700 includes a plurality of control keys 3710 and a plurality of digit keys 3740. Control keys 3710 include a C ↑ key and a C ↓ key for incrementing the channel up or down respectively. Also, an S ↑ key and an S ↓ key is provided for modifying the squelch setting upward or downward respectively. Similarly, a V ↑ key and a V ↓ key is provided for turning the volume up or down, respectively. And a Δ ↑ key and a Δ ↓ key are provided for moving the clarifying frequency (i.e., $f_{s2}$) up or down respectively while receiving sideband signals.

Keyboard 3700 further includes keys LB, UB, and AM for selecting lower sideband, upper sideband or AM mode of operation, respectively. Also a CC key is provided for enabling the clear channel function, while a BC key is provided for enabling the busy channel function. A # key is provided for assigning a call number to the transceiver, and for enabling the transceiver to transmit a call number. A SWR key is provided for reading out the standing wave ratio. An O/F key is provided for enabling or disenabling the transceiver. And a PTT key (push to talk) is provided for enabling the transmit mode of operation.

Additionally, digit keys 3740 are provided for use in conjunction with various of the above-described control keys. For example, digit keys 2740 are used in conjunction with the LB key, UB key, and AM key for selecting a channel and mode of operation simultaneously. The actual sequence in which keys 3740 and keys 3710 are used to activate various functions including those listed in TABLE VI which will be described shortly.

Keyboard 3700 couples via leads 3701 and 3702 to microprocessor 3600 and is sensed thereby. Leads 3701 couple to the K register inputs of processor 2600, whereas leads 3702 couple to the R register outputs of microprocessor 3600. Thus, the state of any key within keyboard 3700 is sensed by microprocessor 3600 by selectively setting bits in register R, and by sensing for a return signal in register K.

Display 3800 also couples to microprocessor 3600 and is controlled thereby. Display 3800 is comprised of a 5-digit LED display 3820 and a digit driver circuit 3810. Leads 3801 couple the output of driver circuit 3810 to the digit inputs of display 3820; while leads 3802 couple the input to driver circuit 3810 to the output of register R of microprocessor 3600. The output of register O of microprocessor 3600 is coupled via leads 3803 to the segment inputs of LED display 3820. Thus, the state of the 5-digit display 3820 is controlled by microprocessor 3600 via its registers R and O.

Microprocessor 3600 is further coupled via lead 3510 to microprocessor 3500. Leads 3510 provide the means whereby messages are sent between microprocessors 3500 and 3600.

Table VI lists several functions which the transceivers of FIGS. 2 performs, and indicates which keys of keyboard 3700 and which messages between the master and slave are utilized to implement each function.

TABLE VI

SELECT CHANNEL & MODE
KEY SEQ. = Most sig. CH. Number, Least Sig.
CH. NUmber, mode Key (e.g., AM/LB/UB)
L1, L2 MESSAGE SEQUENCE:

| | | | | | | |
|---|---|---|---|---|---|---|
| 1-MASTER = D | channel number | channel number | Mode | φ | φ | C |
| 2-SLAVE = C | channel number | channel number | Mode | signal strength | status | C |

VOLUME CHANGE
KEY SEQ. = V ↓ or V ↑
L1, L2 MESSAGE SEQUENCE:

| | | | | | | |
|---|---|---|---|---|---|---|
| 1-MASTER = A | φ | φ | φ | φ | φ | C |
| 2-SLAVE = A | volume | squelch | clarify | clarify | φ | C |
| 3-MASTER = B | volume +1 | squelch | clarify | clarify | φ | C |
| 4-SLAVE = A | volume +1 | squelch | clarify | clarify | φ | C |

SQUELCH CHANGE
KEY SEQ. = S ↓ or S ↑
L1, L2 MESSAGE SEQUENCE:
Same as for volume change, except the squelch digit is updated instead of the volume digit.

CLARIFY
KEY SEQ. = Δ ↓ or Δ ↑
L1, L2 MESSAGE SEQUENCE:
Same as for volume change, except the clarify digits are updated instead of the volume digit.

All of the previously described details may be interrelated by considering typical transceiver operations in conjunction with the transceiver block diagrams of FIGS. 2 and 13. Referring to FIG. 2, for example, suppose an operator wishes to operate on channel 1 in the lower sideband mode. Utilizing keyboard 3,700, the operator sequentially depresses digit keys 0 and 1, and control key LB. In response thereto, processor 3,600 senses the depressed keys, and sends messages via leads 3,510 to the slave processor 3,500.

Slave processor 3,500 interprets the messages and in response thereto sends microcommands to registers 3,400 via leads 3,501. The microcommands indicate clocking frequencies $f_{S1}$, $f_{S2}$, $f_{S3}$, such that the lower sideband of channel 1 will pass through the received signal path. In particular, the microcommands will indicate an $N_1$ of 9,536; and $N_4$ of 55; and $N_5$ of 19,125; and an $N_6$ of 235. Recall that the values of N2 and N3 are fixed at 1,432 and 10, respectively. As a result of these microcommands, clocking module 3,100 generates clocking signal S202 of a frequency 23.84MHz. Similarly, clocking module 3,200 generates clocking signal S702 with frequency 86,932 and also generates clocking signal S902 with a frequency of 20,345Hz.

Mixer 200 mixes signals S2 and frequency $f_{S1}$ to thereby generate signals S3 on lead 201. Frequency $f_{S1}$ was chosen such that channel 1 of signal S3 is centered at frequency 3.125MHz because mixer 200 includes a tank circuit having a resonant frequency of 3.125MHz. As such, signal S3 discriminates between the selected channel and the surrounding channels.

Mixer 300 mixes signal S3 with the fixed frequency of 3.58MHz. The difference between 3.58MHz and 3.125MHz equals 455KHz; and mixer 300 includes a tank circuit having a center frequency of 455KHz. Thus, the output of mixer 300, which is signal S4, contains channel 1 at 455KHz.

Signal S4 is coupled to CCD filter 700 through a switch 600. Switch 600 is controlled by microcommands from processor 3,500. The microcommands are generated in response to the manually activated PTT key on keyboard 3,700.

Filter 700 receives signals S5 and filters the lower sideband from the signal in response to frequency $f_{S2}$ of clocking signals S702. The previously described Table III lists the appropriate $f_{S2}$ frequency. Signal S8, which is the output of the filter, is the lower sideband of channel 1 as the operator selected.

Signal S8 passes through the modulator 900. The modulator 900 simultaneously receives clocking signals on leads 902 which contain the third selectable frequency $f_{S3}$. Demodulator 900 samples the selected sideband signals at frequency $f_{S3}$; and as a result, the selected sideband is frequency shifted to the audio range.

The demodulator output is coupled via lead 901 to volume control unit 1,000, which amplifies its input signals in response to microcommands. These microcommands are entered into register 3,400 by processor 3,500 in response to messages from processor 3,600 indicating that the operator depressed the V↑ or V↓ key. Audio amplifier 1,100 amplifies the output of the volume control unit, and the output of the amplifier is coupled to speaker 1,200.

When the operator wishes to transmit on his selected channel, he simply pushes the PTT key on keyboard 3,700. In response thereto, processor 3,500 generates microcommands which couple the input to filter 700 to the transmit path, and which couple the antenna to the transmit path.

Additionally, processor 3,500 generates microcommands which couple selective call unit 6,300 to the transmit path lead 5,201 via switch 5,200. These microcommands are generated in a sequence such that a frequency of 1,667HZ is first transmitted for a period of several milliseconds.

Note also that during this time period, the receiving transceiver will have its squelch broken, and thus will enable its autolock logic 2,600 via microcommand from processor 3,500. The receiving transceiver monitors the actual frequency transmitted by enabling autolock unit 2,600, by sending microcommands to multiplexer 2300 which select the autolock unit, and by reading signals on leads 2,401. The receiving transceiver then compares the actual frequency of the carrier with the nominal frequency, and makes adjustments to frequency $f_{S2}$ which compensate for any differences. In one embodiment, the receiving unit makes the adjustments by modifying multiplier N5 in clocking module 3,200.

Various embodiment of the invention have now been described in detail. Since it is obvious that many changes and modifications can be made in the above details without departing from the nature and spirit of the invention, it is understood that the invention is not to be limited to said details except as set forth in the appended claims.

What is claimed is:

1. A radio receiver having a digital processor controlled signal clarifier, said radio receiver comprising:
   (a) mixer means having inputs coupled to simultaneously receive (1) input signals comprised of a plurality of spaced apart frequency channels and (2) mixing frequency signals of a first selectable frequency, for generating in response thereto, output signals in which said input signal is shifted in frequency such that the center frequency of a selected one of said frequency channels is shifted to a predetermined frequency;
   (b) mixing frequency generator means having inputs coupled to receive first digital coded signals identifying said first selectable frequency for generating said mixing frequency signals of said first selectable frequency in response thereto;
   (c) a charge transfer device transversal filter means having a selectively controllable passbandwidth centered about a finely tuneable center frequency, said filter means being coupled to said mixer means for defining a selected frequency band of said output signals to pass only said selected frequency band of said selected one of said frequency channels, said filter being coupled to receive simultaneously with said output signals, filter clocking signals of a second selectable frequency, said filter means being responsive to said filter clocking signal for controlling the passbandwidth and finely tuneable center frequency of said filter means in response to the frequency of said clocking signal;
   (d) filter clocking signal generator means having inputs coupled to receive second digital coded signals identifying said second selectable frequency for generating said filter clocking signals of said second selectable frequency in response thereto;
   (e) keyboard means having a plurality of channel selection keys, at least one band selection key and at least one clarify key; and
   (f) digital processor means coupled to said keyboard means and to said mixing frequency and filter clocking signal generators, said digital processor means being responsive to actuation of said channel selection keys for generating said first digital coded signals, being responsive to activation of said at least one band selection key for computing the passbandwidth and center frequency of said filter means and for generating said second digital coded signals in accordance with the computed passband-width and center frequency and being responsive to said at least one clarify key for altering the computed center frequency of said filter means in fine increments and for generating said second digital coded signals in accordance with the altered center frequency.

2. A receiver according to claim 1 wherein said frequency bands are single sidebands.

3. A receiver according to claim 1 wherein said clocking means generates said first selectable frequency in increments of the frequency spacing between adjacent ones of said spaced apart channels.

4. A receiver according to claim 1, wherein the frequency of said filter clocking signal is controlled by said digital processor means to adjust in increments several times smaller than the bandwidth of said channels.

5. A receiver according to claim 1 wherein said filter clocking signal generator means is comprised of:
 (a) a phase locked loop having an input for receiving a reference frequency $f_r$ and a feedback loop comprised of a first programmable counter means of programmable count $N_1$, and
 (b) a second programmable counter of programmable count $N_2$ coupling said phase locked loop to said filter means, said clocking means generating clocking signals at said second selectable frequency $f_{s2} = f_r(N_1/N_2)$ where $N_1$ and $N_2$ are integers determined by said second digital coded signals applied to said first and second programmable counters.

6. A receiver according to claim 5, wherein said mixing frequency generator means is comprised of:
 (a) a phase locked loop having an input for receiving a frequency $f_r$ and a feedback loop comprised of a third programmable counter means of programmable count $N_3$, and
 (b) a fourth programmable counter of programmable count $N_4$ coupling said phase locked loop to said mixer means, said clocking means generating clocking signals at said first selectable frequency $f_{s4} = f_r(N_3/N_4)$ where $N_3$ and $N_4$ are integers determined by said first digital coded signals applied to said third and fourth programmable counters.

7. A receiver according to claim 6 further including
 (a) sampling demodulator means having a signal input coupled to said filter means for receiving therefrom filtered signals of selected channel, selected bandwidth and finely tuned center frequency, and having a sampling input coupled to receive a sampling frequency clock signal; and
 (b) fifth programmable counter means of variable count $N_5$ coupling said first phase lock loop clocking means to said sampling input, said fifth counter means being responsive to third digital coded signals from said digital processor means for controlling the sampling frequency of said sampling frequency clock signal.

8. A receiver according to claim 7, wherein said sampling frequency is controlled in increments which are several times smaller than the bandwidth of said channels.

* * * * *